United States Patent
Johnson et al.

(10) Patent No.: US 7,294,398 B2
(45) Date of Patent: Nov. 13, 2007

(54) DEUTERATED AMORPHOUS CARBON COATING FOR INFRARED OPTICS

(75) Inventors: James Neil Johnson, Schenectady, NY (US); Eric Breitung, Albany, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 88 days.

(21) Appl. No.: 11/034,606

(22) Filed: Jan. 13, 2005

(65) Prior Publication Data

US 2006/0154073 A1   Jul. 13, 2006

(51) Int. Cl.
*B32B 9/00* (2006.01)
(52) U.S. Cl. ............. 428/408; 428/336; 428/426; 428/704
(58) Field of Classification Search ........... 428/408, 428/336, 426, 704
See application file for complete search history.

(56) References Cited

U.S. PATENT DOCUMENTS

| 6,844,070 | B2 | 1/2005 | Johnson et al. |
| 2004/0120685 | A1* | 6/2004 | Breitung ............... 385/143 |

OTHER PUBLICATIONS

Fuchs et al "Hydrogen induced vibrational and electronic transitions in chemical vapor deposited diamond, identified by isotopic substitution" Appl. Phys. Lett 66 (2) Jan. 9, 1995.*

* cited by examiner

*Primary Examiner*—Archene Turner
(74) *Attorney, Agent, or Firm*—Scully, Scott, Murphy & Presser, P.C.

(57) ABSTRACT

The present invention is directed to an IR transmissive coating comprised of deuterated amorphous carbon (a-C:D).

12 Claims, No Drawings

DEUTERATED AMORPHOUS CARBON COATING FOR INFRARED OPTICS

FIELD OF THE INVENTION

The present invention is directed to optical coatings exhibiting relatively low energy absorbance, such coatings suited for use in the field of infrared (IR) optics. The coatings of the present invention may be used to impart abrasion resistance, to improve adhesion, to improve anti-reflection, to list just a few possible coating applications.

BACKGROUND OF THE INVENTION

Various devices including aircraft and guided missiles which travel at high velocities are controlled by transmitting a signal from a remote station to an infrared (IR) sensor or window located on-board the device. While in operation, the IR sensor or window is exposed to considerable heat loading and erosion due to impact of particles. Such exposure may exceed the working capabilities of the IR sensor or window. Even the smallest atmospheric dust particles can scratch the IR sensor or window, which over time can cause considerable erosion effects on the optical transmissivity of the IR sensors or windows. The term "optical transmissivity", as used herein, refers to the ability a material to allow desired wavelengths of electromagnetic radiation to pass through it.

Materials which can be used to make IR sensors or windows include, but are not limited to: zinc sulfide (ZnS), zinc selenide (ZnSe), germanium (Ge), silicon (Si), gallium arsenide (GaAs), gallium phosphide (GaP), fused silica, aluminum oxynitride (AlON), sapphire ($Al_2O_3$), magnesium oxide (MgO), spinel (MgO—$Al_2O_3$), cubic zirconia (c-$ZrO_2$), lanthanum-doped yttria, yttria ($Y_2O_3$), mixed fluoride glasses, chalcogenide glasses and other optical transmissive materials. These optical transmissive materials can be temperature sensitive (i.e., they have a low softening temperature) that can fail due to thermal shock caused by atmospheric friction at high velocities. Additionally, optical transmissive materials are generally soft materials and therefore damage easily upon use.

Various coatings are required to enhance the performance of optical elements used in infrared imaging systems. Infrared devices typically operate in the 3-5 and 8-12 micron regions due to the lack of absorption of IR energy by the atmosphere at those wavelengths. However, where a material used for IR coatings is generally comprised of C—H and/or N—H bonds, such material will absorb in the 3-5 and 8-12 micron range. Coatings and films are typically applied to provide antireflective properties and protect optical transmissive materials from damage caused by thermal shock, abrasion, or erosion. One coating that has been successfully employed in protecting optical transmissive materials is a hard carbon film that has diamond-like properties, e.g., a diamond-like carbon (DLC) film. However, DLC films often require high-temperatures and atomic hydrogen for deposition, both of which can degrade the optical transmissive material where various interlayers are not employed. Where suitable interlayers have been employed, such interlayers may delaminate at high-temperatures, further complicating the process.

Furthermore, interlayers and DLC coatings may reduce the level of optical transmissivity required for such devices to a level below an acceptable threshold. As indicated above, the C—H bond is absorptive of energy in the range in which infrared transmissions occur. Thus, a useful protective coating or interlayer for use with optical transmissive materials must itself be acceptably optically transmissive. The optical transmissivity of the coating or interlayer itself must also be able to withstand high-operating temperatures.

SUMMARY OF THE INVENTION

The present invention is directed to an IR transmissive coating that exhibits relatively low absorption of infrared energy when the coating has been applied to an IR transmissive material.

In a specific embodiment, the present invention is directed to an IR transmissive coating comprised of deuterated amorphous carbon (a-C:D).

In a more specific embodiment, the present invention is directed to an IR transmissive material coated with an IR transmissive coating exhibiting relatively low absorption of infrared energy. In yet a more specific embodiment, the present invention is directed to an IR transmissive material coated with an IR transmissive coating comprised of deuterated amorphous carbon (a-C:D).

The coatings disclosed herein provides a low absorption coating for IR-transmissive materials that can be used as adhesion layers, abrasion-resistant layers, and antireflection coatings, among other possibilities.

It is believed that a coating of deuterated amorphous carbon (a-C:D) reduces absorption of wavelengths of infrared energy to shorter than 4 microns and reduces absorption of wavelengths between 8-12 microns. Use of a-C:D films on optical elements allows for thicker (e.g., 8.0 micron) coatings without significant loss of energy through absorption.

DETAILED DESCRIPTION OF THE INVENTION

The term "IR transmissive material" is used herein to denote a substrate that transmits IR energy of wavelengths of from about 0.1 to about 20 microns, preferably from about 1 to about 15 microns and most preferably from about 2 to about 12 microns. Sensors, windows or other materials (such in the coatings disclosed herein) are said to be IR transmissive if greater than about 75% of IR transmission occurs.

Suitable IR transmissive materials that can be employed in the present invention include, but are not limited to: chalcogenides and other low $T_g$ (i.e., glass transition temperature) substrates. The term "chalcogenide" is used herein to denote a non-oxygen-containing binary or ternary compound of a chalcogen, i.e., sulfur, selenium, and tellurium, with a more electropositive element. Illustrative examples of chalcogenides that can be employed in the present invention include, but are non limited to: ZnS, ZnSe, $Ge_{33}As_{12}Se_{55}$, $Ge_{28}Sb_{12}Se_{60}$, $As_2S_3$, and $As_ySe_{1-y}$ where y is greater than 0, but less than 1. A highly preferred IR transmissive material employed in the present invention is $As_ySe_{1-y}$.

Plasma enhanced chemical vapor deposition can be employed in order to deposit the amorphous deuterated carbon coating on the IR transmissive substrate.

FIG. 1 schematically illustrates a reactor 10 and associated equipment for the PECVD technique. At least one cathode 20, typically made of tungsten, is disposed in a cathode housing 30. Anode plate 40 is disposed at one end of cathode housing 30. Optionally, at least a cathode housing is electrically floating. A voltage applied between cathode 20 and anode 40 generates an arc for plasma generation. A carrier gas such as argon, is fed through line 50 to the arc. A plasma is generated and exits a nozzle or orifice 70 at the center of anode 40. A second reactant gas is optionally fed through supply line 80 to a point downstream from orifice 70. Supply line 80 may also terminate with a perforated ring disposed within expanding plasma beam 84 for better mixing. Other reactant supply lines can be provided for different reactant species if desired. Radicals are generated from reactant gases, combined, carried to substrate 90, and deposited thereon, which substrate is supported on substrate holder 100. Substrate holder 100 is disposed opposite and at a distance from nozzle 70 and is movable relative to nozzle 70 by substrate-holder shaft 110. Reactor 10 is kept under vacuum via vacuum connection 112. For example, when the desired coating on the substrate is deuterated amorphous carbon, the reactant gas can be deuterated benzene.

Preferably, a pre-etch of the substrate is employed. During pre-etching reactive species and energetic ions in the plasma are used to enhance adhesion of the coating or film to the substrate material. Pre-etching can serve several purposes simultaneously: removal of organic residues from the surface, removal of native oxide from the surface, and functionalization (formation of reactive sites) of the surface prior to the start of deposition.

Preferably, average substrate temperature is maintained at about 50° C. to about 130° C. throughout the process; more preferably, about 60° C. to about 90° C., and even more preferably about 70° C. to about 80° C. Preferably, carrier gas flow is about 30 cc/s to about 200 cc/s. More preferably, about 60 cc/s to about 150 cc/s, and more preferably, about 75 cc/s about 125 cc/s. Pressure is maintained preferably at about 75 mTorr to about 250 mTorr, more preferably about 100 mTorr to about 200 mTorr, and even more preferably, about 125 mTorr to about 175 mTorr. Pre-etch input power can be maintained at about 50 W to about 150 W. During deposition, the plasma input power can be maintained at about 10 W to 100 W. More preferably, about 25 W to about 75 W, and even more preferably, about 40 W to about 60 W. Deposition and etch times can be selected by the person of ordinary skill in the art to provide in a coating layer of desired thickness.

By eliminating at least some hydrogen from the plasma enhanced chemical vapor deposition (PECVD) precursor mixture, or, in other words, substituting deuterium containing precursors for hydrogen-containing precursors, it is believed that no hydrogen bonds can be formed in the deposited coating. Since C—H bonds readily absorb energy in the 3-5 and 8-12 micron ranges, and since hydrogen is replaced with deuterium in the present process, C-D bonds are formed instead of C—H. The use of deuterated carbon bonds shifts the absorbance and allows the coatings to be preferentially tailored for a specific application. Thus coatings of a-C:D applied to the surfaces of IR optical elements provide the needed functional performance while increasing transmittance over previously used materials. A PECVD system was used to generate the a-C:D coatings. While any volatile deuterated hydrocarbon precursor will work (e.g. $CD_4$, deuterated alkanes, deuterated alkenes, and deuterated aromatics), deuterated benzene ($C_6D_6$) was used for the a-C:D described herein.

It should be understood that not all hydrogen ions need to be substituted with a deuterium ion in the deuterium-containing precursors employed in the present invention.

The a-C:D coatings applied to infrared optical elements provides the needed optical performance (e.g., adhesion, abrasion-resistance, antireflection) while enhancing transmission characteristics over previously used materials. Because of the improved transmittance, thicker coating designs can be utilized thereby increasing the applicability of these coatings for IR optical systems.

Coating thicknesses in the 10 nm to 8 micron range can be used depending on the application.

FIG. 2 shows that IR spectrum or both a-C:H and a-C:D are displayed showing the shift of absorptions in the 2900 cm-1 range for the H-containing sample to higher energy in the a-C:D: sample.

What is claimed is:

1. An infrared transmissive optical element comprising an infrared transmissive deuterated amorphous carbon coating deposited on an infrared transmissive substrate.

2. The infrared transmissive optical element of claim 1 wherein the deuterated amorphous carbon coating is produced via a plasma enhanced chemical vapor deposition process.

3. The infrared transmissive optical element of claim 2, wherein the deuterated amorphous carbon coating is derived from a precursor selected from the group consisting of deuterated alkanes, deuterated alkenes and deuterated aryls.

4. The infrared transmissive optical element of claim 2 wherein the deuterated amorphous carbon coating is derived from deuterated benzene.

5. The infrared transmissive optical element of claim 1, wherein the deuterated amorphous carbon coating is derived from a precursor selected from the group consisting of deuterated alkanes, deuterated alkenes and deuterated aryls.

6. The infrared transmissive optical element of claim 1, wherein the deuterated amorphous carbon coating is derived from deuterated benzene.

7. The infrared transmissive optical of claim 1, wherein the deuterated amorphous carbon coating in about 10 nm to about 8 microns thick.

8. The infrared transmissive optical element of claim 1 wherein the substrate is an IR transmissive material is a chalcogenide.

9. The infrared transmissive optical element of claim 8 wherein the chalcogenide is selected from the group consisting of ZnS, ZnSe, $Ge_{33}As_{12}Se_{55}$, $Ge_{28}Sb_{12}Se_{60}$, $As_2S_3$, and $As_ySe_{l-y}$, where y is greater than 0, but less than 1.

10. The infrared transmissive optical element of claim 1 wherein the element is a sensor or window.

11. The infrared transmissive optical element of claim 1 wherein the deuterated amorphous carbon is present as a protective coating.

12. The infrared transmissive optical element of claim 1 wherein the deuterated amorphous carbon is present as an antireflection coating.

* * * * *